US005608610A

United States Patent [19]
Brzezinski

[11] Patent Number: 5,608,610
[45] Date of Patent: Mar. 4, 1997

[54] MECHANICALLY FLOATING MULTI-CHIP SUBSTRATE

[75] Inventor: Dennis Brzezinski, Sunnyvale, Calif.

[73] Assignee: Hewlett-Packard Company, Palo Alto, Calif.

[21] Appl. No.: 529,373

[22] Filed: Sep. 18, 1995

Related U.S. Application Data

[63] Continuation of Ser. No. 400,315, Mar. 6, 1995, abandoned, which is a continuation of Ser. No. 89,082, Jul. 8, 1993, abandoned, which is a continuation-in-part of Ser. No. 957,309, Oct. 6, 1992, Pat. No. 5,323,292.

[51] Int. Cl.⁶ .................................................. H05K 7/20
[52] U.S. Cl. ........................... 361/704; 257/713; 257/727; 361/715; 361/718
[58] Field of Search ........................ 165/80.3; 174/16.3; 257/718–719, 726–727; 361/690, 699, 704–722, 728, 730

[56] References Cited

U.S. PATENT DOCUMENTS

| 3,593,064 | 7/1971 | Wagner et al. ........................ 317/100 |
| 4,034,468 | 7/1977 | Koopman ................................. 29/628 |
| 4,072,188 | 2/1978 | Wilson et al. .......................... 165/80 |
| 4,092,697 | 5/1978 | Spaight .................................. 361/386 |
| 4,109,707 | 8/1978 | Wilson et al. .......................... 165/46 |
| 4,517,624 | 5/1985 | Wessely ................................. 361/705 |
| 4,521,829 | 6/1985 | Wessely ................................. 361/705 |
| 4,531,146 | 7/1985 | Cutshaw ................................. 357/82 |
| 4,563,725 | 1/1986 | Kirby ..................................... 361/388 |
| 4,612,978 | 9/1986 | Cutchaw ............................. 165/104.33 |
| 4,750,086 | 6/1988 | Mittal .................................... 361/382 |
| 4,771,365 | 9/1988 | Cichocki et al. ....................... 361/387 |

(List continued on next page.)

FOREIGN PATENT DOCUMENTS

| 368743A2 | of 0000 | European Pat. Off. . |
| 0103067A2 | 3/1984 | European Pat. Off. . |
| 0243710A2 | 11/1987 | European Pat. Off. . |
| 2354260 | 6/1974 | Germany ................................. 361/385 |
| 4131200 | 1/1993 | Germany . |
| 1055194 | 1/1967 | United Kingdom ................... 361/697 |

OTHER PUBLICATIONS

Parsapour, H. B., "Convection Cooling in Small Terminals," IBM Tech. Discl. Bulletin, vol. 24, No. 2, Jul. 1981, p. 1222.

Darveaux et al., "Thermal Analysis of a Multi–Chip Package Design", Journal of Electronic Materials, vol. 18, No. 2, 1988, pp. 267–274.

Darveaux et al., "Backside Cooling of Flip Chip Devices in Multichip Modules", ICMCM Proceedings '92, pp. 230–241.

*Primary Examiner*—Gregory D. Thompson

[57] ABSTRACT

A multi-chip module includes a mechanically floated substrate on which integrated circuit devices are mounted. The substrate is located within a heat exchanger. In one embodiment, a spring or an array of springs biases the substrate upwardly to press the integrated circuit devices against a surface within the heat exchanger. The substrate is displaceable with respect to the heat exchanger, allowing accommodations to differences in thermal expansion coefficients and to non-uniformities resulting from less than exact manufacturing tolerances of the substrate, the heat exchanger and the integrated circuit devices. Another embodiment includes resting the substrate on a conformable membrane that is used to entrap a fixed volume of thermally-conductive liquid. The membrane-and-liquid arrangement mechanically floats the substrate and ensures a proper integrated circuit device/exchanger thermal interface. A flexible multi-conductor interconnect is electrically coupled to the substrate to allow conduction of signals to and from the substrate without interfering with the ability of the substrate to float mechanically. Also disclosed is a module in which the membrane-and-liquid arrangement is used at the integrated circuit device side of the substrate to achieve a deformable electrical and thermal flow path from the integrated circuit devices to the heat exchanger. The membrane adapts to variations in the heights and/or angles of the integrated circuit devices.

7 Claims, 5 Drawing Sheets

U.S. PATENT DOCUMENTS

| | | | |
|---|---|---|---|
| 4,790,373 | 12/1988 | Raynor et al. | 361/697 |
| 4,879,629 | 11/1989 | Tustaniwskyj et al. | 361/385 |
| 4,933,747 | 6/1990 | Schroeder | 357/82 |
| 4,938,279 | 7/1990 | Betker | 165/46 |
| 4,964,458 | 10/1990 | Flint et al. | 165/80.4 |
| 4,997,032 | 3/1991 | Danielson et al. | 165/46 |
| 5,000,256 | 3/1991 | Tousignant | 165/46 |
| 5,001,548 | 3/1991 | Iversen | 357/82 |
| 5,006,924 | 4/1991 | Frankeny et al. | 357/82 |
| 5,046,552 | 9/1991 | Tousignant | 165/46 |
| 5,050,037 | 9/1991 | Yamamoto et al. | 361/385 |
| 5,065,279 | 11/1991 | Lazenby et al. | 361/386 |
| 5,094,769 | 3/1992 | Anderson | 252/71 |
| 5,157,588 | 10/1992 | Kim et al. | 361/396 |
| 5,168,348 | 12/1992 | Chu et al. | 257/713 |
| 5,177,667 | 1/1993 | Graham et al. | 361/385 |
| 5,237,203 | 8/1993 | Massaron | 257/719 |
| 5,268,814 | 12/1993 | Yakubowski | 361/704 |
| 5,323,292 | 6/1994 | Brzezinski | 361/689 |
| 5,430,611 | 7/1995 | Patel et al. | 361/719 |

MECHANICALLY FLOATING MULTI-CHIP SUBSTRATE

CROSS REFERENCE TO RELATED APPLICATION

This is a continuation of application Ser. No. 08/400,315, filed on Mar. 6, 1995, now abandoned which is a continuation of application Ser. No. 08/089,082 filed on Jul. 8, 1993, now abandoned which is a Continuation-in-part of Ser. No. 957,309, filed Oct. 6, 1992, now U.S. Pat. No. 5,323,292.

TECHNICAL FIELD

The present invention relates generally to integrated circuit packages and more particularly to modules having an array of integrated circuit chips electrically connected to a substrate contained within a housing.

BACKGROUND ART

Multi-chip modules play an increasingly important role in the electronics industry. Integrated circuit chips within a module may be functionally equivalent, such as an array of memory chips to provide a capability of forty megabytes. Alternatively, the chips may be functionally related, such as a chip set comprising a read only memory chip, a random access memory chip, a microprocessor and an interface chip.

As the number of chips confined within a single module increases, the importance of providing adequate cooling also increases. U.S. Pat. No. 5,006,924 to Frankeny et al., U.S. Pat. No. 5,001,548 to Iversen, U.S. Pat. No. 4,879,629 to Tustaniwskyj et al. and U.S. Pat. No. 4,750,086 to Mittal all describe use of a liquid coolant that is forced to flow through a multi-chip module to absorb thermal energy, whereafter the liquid coolant is removed from the module at an outlet port. Providing a liquid coolant loop through a module is an effective may of ensuring adequate cooling, but is an expensive cooling method. Requiring a mechanism for providing a forced flow of liquid coolant would be cost inefficient in such applications as computer workstations.

For small and medium scale applications in which forced liquid cooling is not a cost-efficient option, heat exchangers, or heat sinks, are used to dissipate thermal energy into the atmosphere surrounding a multi-chip module. Particularly for high power chips that generate a significant amount of thermal energy, this places an importance on the heat transfer interface of the chips to the heat exchanger. Ideally, contact is made between the integrated circuit chips and the structure that begins the thermal path to the surrounding atmosphere. A difficulty with this ideal is that during the fabrication of a manufacturing lot of multi-chip modules, there will be dimensional differences among the modules and even among the various chips within a single module. For example, chips are often encased within a chip carrier before being mounted to a component surface of a substrate that is attached to the heat exchanger. The carriers may have slight differences in height and/or the mounting of the carriers to the substrate may result in slight variations in height or angle with respect to the component surface of the substrate. Various fabrication and machine tolerances are additive, so that the carriers within a multi-chip module will not have coplanar upper surfaces. Bellows assemblies with forced liquid cooling for adaptation to individual chips or carriers of a module, such as described in the Mittal and Tustaniwskyj et al. patents, may be used where cost is not a major concern, but ensuring adequate contact between individual chips and a heat dissipating structure is more difficult in many applications.

Alternatively, thermally conductive pillows may be placed between the heat spreader and the chips, as described in U.S. Pat. No. 5,000,256 to Tousignant, U.S. Pat. No. 4,997,032 to Danielson et al. and U.S. Pat. No. 4,092,697 to Spaight. For example, Spaight describes an electrically nonconductive film contacting a single chip at a first side of the nonconductive film and containing a thermal liquid material at a second side.

It is an object of the present invention to provide a multi-chip module that achieves an adaptive heat transfer interface in a reliable, cost-effective manner. A further object is to provide a multi-chip module that achieves an adaptive heat transfer interface without forcing liquid cooling and that provides an electrical path to semiconductor chips of the module.

SUMMARY OF THE INVENTION

The above object has been met by a stand-alone module in which integrated circuit devices, such as semiconductor chips or chip carriers, are caused to be displaced in order to adapt to a heat exchanger. The adaptive displacement may be in response to a difference in thermal expansion of the heat exchanger relative to the integrated circuit devices, and is accomplished by mechanically floating a substrate on which the devices are mounted. Thus, rather than incorporating a structure to allow a heat exchanger to adapt to relative positions of integrated circuit devices, any adaptations at the device/exchanger interface are made by repositioning the substrate.

The integrated circuit devices are mounted on a component surface of the substrate. The substrate is contained within a chamber of the heat exchanger and is mounted to allow the substrate to "float" within the chamber. In one embodiment, the substrate is biased to press the integrated circuit devices against an upper wall of the chamber. For example, one or more springs may be disposed between the substrate and a lower wall of the chamber to press the substrate upwardly. Preferably, the spring is packed within a thermal grease to provide a thermal path from the substitute to the heat exchanger, thereby providing a thermal flow path for the dissipation of thermal energy. This thermal flow path is in addition to the path originating at the device/exchanger interfaces.

Mechanical floating can also be achieved by use of a conformal mechanism at the surface of the substrate opposite to the integrated circuit devices. A thin membrane that is parallel to the substrate is used to entrap a fixed volume of liquid. Preferably, the liquid is under pressure by the entrapment between the heat exchanger and the membrane, so that the liquid presses the membrane outwardly. The pressure on the membrane ensures a compression contact of the membrane against the substrate, so as to press the integrated circuit devices against the heat exchanger. The membrane and the liquid preferably are thermally conductive. For example, the membrane may be a stainless steel member and the liquid may be distilled water having a concentration of an additive to retard oxidation of the membrane and the heat exchanger.

In another embodiment, an arrangement of a conformable membrane and entrapped liquid is formed at both the upper and lower walls of the chamber that houses the substrate. Thus, the substrate and its integrated circuit devices are mechanically floated between the two conformable membrane-and-liquid arrangements.

An advantage of the above-described embodiments is that the floating substrate allows displacement of the integrated circuit devices in a manner to first achieve and then maintain desired device/exchanger interfaces. The position of the membrane can be adjusted to compensate for variation in the heights and/or the angles of the integrated circuit devices relative to the component surface of the substrate. Moreover, during operation of the module, compensation is possible for differences in thermal coefficients of expansion for the integrated circuit chips, the substrate and the heat exchanger. Depending upon the thermal coefficients, the ability of the substrate to float within the chamber may provide a strain release or may provide a means for causing the integrated circuit devices to follow the outward expansion of the heat exchanger.

The module preferably includes a flexible cable that channels signals and utilities to and from the substrate without interfering with the ability of the substrate to float within the chamber.

In another embodiment, the module includes a substrate onto which the semiconductor chips are mechanically and electrically mounted. While not critical, the substrate is a silicon substrate and the chips are surface mounted using a solder bump technique. A silicon substrate provides a high degree of flatness, thereby reducing variations in thickness of the substrate as a source of non-coplanar chips. Moreover, silicon is better matched to the chips in terms of the thermal coefficients of expansion than are standard printed circuit board materials.

The heat exchanger is fixed to the substrate at the component surface of the substrate. A fluid-tight chamber is defined between the membrane and the heat exchanger. The fixed volume of liquid is contained within the fluid-tight chamber. Preferably, the liquid is under pressure by the entrapment between the heat exchanger and the membrane, so that the liquid presses the membrane outwardly. The membrane extends generally parallel to the chips. The liquid pressing against the membrane ensures a compression contact of the membrane against each semiconductor chip, regardless of variations in heights and angles.

The membrane is made of an electrically conductive material that forms an electrical path from the grounded heat exchanger to the back sides of the semiconductor chips. This grounding provides an advantage over typical prior art structures, since the grounding of chips containing CMOS devices is often desirable.

An advantage of the present invention is that it provides a conformal heat flow path from the chips to the heat exchanger. Heat is channeled from the chips to the thermally conductive membrane and liquid and then to the heat exchanger where the energy can be dissipated into the surrounding atmosphere. The conformal thermal interface not only allows adaption to differences in chip heights and chip angles resulting from manufacturing tolerances, but also provides a strain release for chip expansion during operation. The chip expansion varies with the thermal coefficients of expansion of the chips and the material used to form any chip carriers. Preferably, the stainless steel membrane has a thickness in the range of 0.0005 inch and 0.001 inch. A membrane that is too thin will be unreliably fragile, whereas a membrane that is too thick will not have the necessary conformity.

As compared to traditional packaging which merely employs a heat sink, the present invention achieves a greater cooling capability. This is particularly true where a second heat exchanger is attached to the substrate at the side opposite to the component surface. Optionally, integrated circuit chips may be mounted on both major surfaces of the substrate. The double-sided substrate can then be entrapped between two conformal interfaces, each comprising a thermally conductive membrane and a static body of liquid entrapped between the membrane and a heat exchanger.

Utilizing the present invention, higher power integrated circuit chips can be placed closer together at a lower and more uniform temperature. Closer component spacing allows higher performance products, since electrical paths can be shortened. Moreover, lower component junction temperatures yield higher performance as well as increased component reliability. It is predicted that an improvement of thirty-four percent in the gate delay for CMOS circuits can be achieved.

The present invention integrates structural support, protection from the external environment, radio frequency shielding and a conformal heat transfer interface. Thus, replacement merely requires removing a module from a motherboard and plugging in a replacement module. Plumbing connections to an external source of liquid coolant are not necessary. Nor is it necessary to provide secondary housing to contain RF radiation, since grounding the heat exchangers sufficiently protects against RF radiation leakage.

Also disclosed is a module having double-sided cooling. First and second heat sinks are mounted at the opposed major surfaces of a multi-chip substrate. A first thermal energy flow path is from the chips to the first heat sink for dissipation into the surrounding atmosphere. A second thermal energy flow path is from the chips to the substrate and then to the second heat sink. The double-sided feature significantly improves the thermal characteristics of a multi-chip module.

BEST MODE FOR CARRYING OUT THE INVENTION

A. Conformal Heat Transfer Interface

Figure 1:
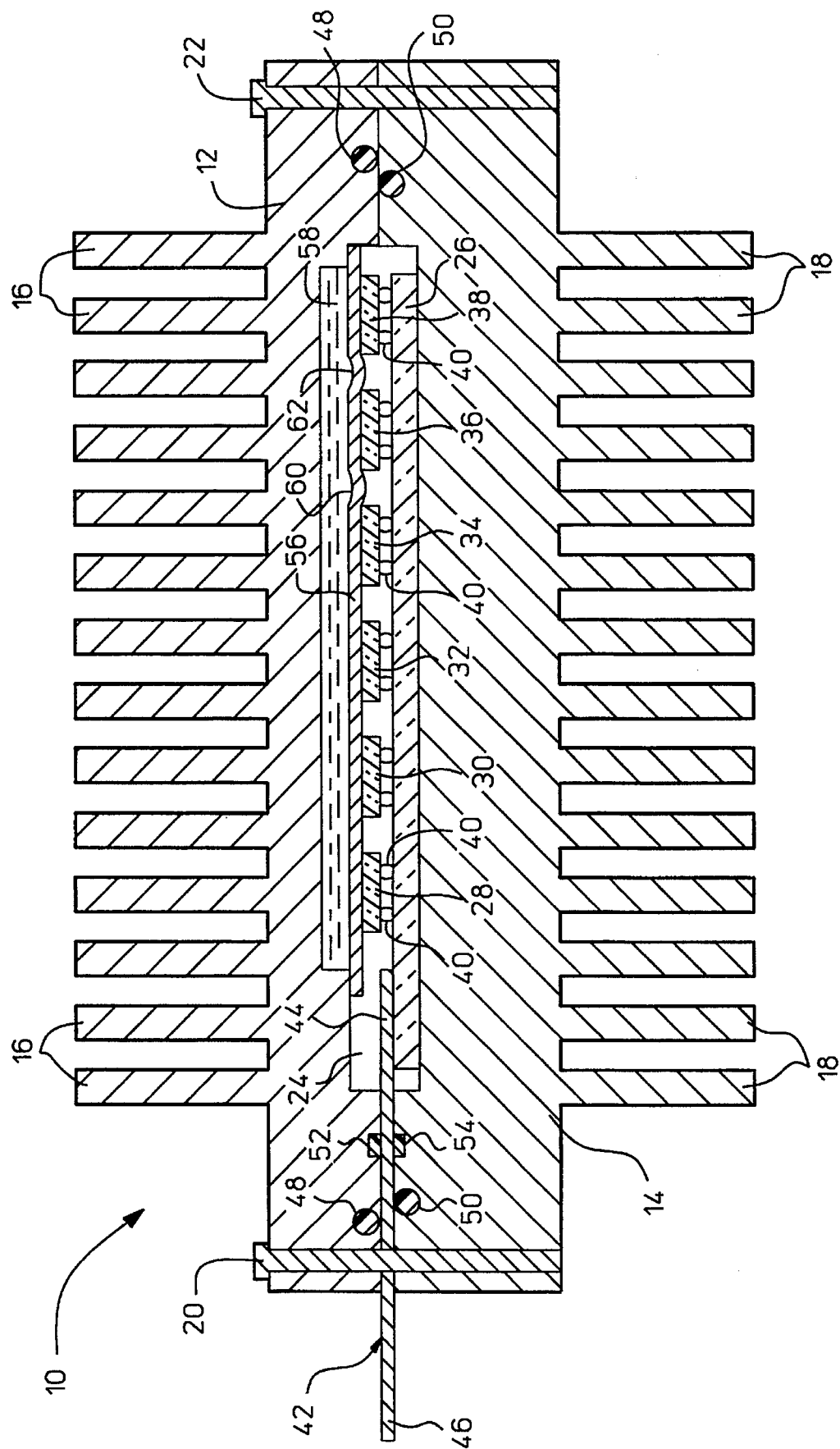
FIG. 1 is a side sectional view of a multi-chip module having a double-sided heat exchanger and having a conformal heat interface.

With reference to FIG. 1, a multi-chip module 10 includes first and second heat exchangers, or heat sinks 12 and 14. The heat sinks include parallel fins 16 and 18 that provide a greater surface area for dissipating heat into the surrounding atmosphere. Finned heat sinks made of aluminum or an aluminum alloy are known in the art.

The first and second heat sinks 12 and 14 are held together by two or more screws 20 and 22. The screws are externally threaded members that tighten into internal threads of the second heat sink.

The first and second heat sinks 12 and 14 have center cavities that define a substrate chamber 24 when the heat sinks are fastened together. Within the substrate chamber 24 is a substrate 26 for the mounting of integrated circuit devices, such as chips 28, 30, 32, 34, 36 and 38. In a preferred embodiment, the substrate 26 is a silicon substrate. The silicon substrate provides a match of the thermal coefficient of expansion of the integrated circuit chips 28-38. The matching of coefficients is important in minimizing the potential of damage that can result from mechanical stresses induced during operation of the module 10.

The solder bumps 40 electrically and mechanically connect the chips 28-38 to the silicon substrate 26. The solder bumps are formed in a conventional manner on the input/output pads and the utility pads on the active side of the chips. While the chips are shown as being carrierless chips, this is not critical. Moreover, other methods of connecting the chips to the silicon substrate may be used.

Circuit traces, not shown, along the silicon substrate 26 interconnect the integrated circuit chips 28-38 and bring signals and utilities of the chips to and from an edge of the silicon substrate. A lead frame 42 has inner lead ends 44 that are bonded to the edge of the silicon substrate at input/output contacts, not shown. Outer lead ends 46 extend to the exterior of the module 10 for connection to a connector, a printed circuit board or the like. Preferably, the lead frame 42 is a multi-level assembly, having an array of generally parallel metal leads on each level. However, other types of interconnect assemblies may be used. Additionally, the lead frame may extend from more than one edge of the silicon substrate.

A pair of o-ring seals 48 and 50 protect the substrate chamber 24 from particle contaminants that may otherwise enter between the first and second heat sinks 12 and 14. The lead frame 42 is trapped between the two seals 48 and 50. Strips of sealing tape 52 and 54 are also used to protect the substrate surface 24. In addition to protection from particle contaminants, the o-rings and the sealing tape prevent entrance of corrosion-inducing matter. In place of the o-rings, epoxy or polyimide may be injected.

The passive side of each integrated circuit chips 28-38 is the major side opposite to the solder bumps 40. Ideally, the passive sides of the chips are coplanar. However, various manufacturing limitations will cause differences in the heights and the angles of the chips relative to each other and to the silicon substrate 26. As described above, one reason for forming the substrate 26 out of silicon is to provide a better matching of coefficients of thermal expansion, as compared to standard printed circuit board materials. A second reason for selecting silicon is that a greater degree of flatness can be achieved without difficulty. However, differences among the chips can still result from variations in such factors as solder bump attachment, tolerances in the formation of the substrate-contacting surface of the second heat sink 14, and variations in the fabrication of the chips themselves and any carriers that may be integral with the chips.

FIG. 1 includes a conformal heat transfer interface between the chips 28-38 and the first heat sink 12, thereby compensating for any non-coplanarity among the passive sides of the chips. Compensation maximizes the efficiency of conducting thermal energy from the chips 28-38 to the atmosphere surrounding the module 10.

A first element of the conformal heat transfer interface is a metallic membrane 56. The metallic membrane should be thin, chemically stable and thermally conductive. A length of stainless steel having a thickness in the range of 0.0005 inch and 0.001 inch may be fastened to the first heat sink 12. Thinness is a concern for most thermally conductive materials because such materials typically are not easily conformed to the shape of contacting surfaces when the membrane is thick. However, a membrane that is too thin is unreliably fragile. The membrane should be made of a ductile, tear-resistant material.

As shown in FIG. 1, the ends of the metallic membrane 56 contact the first heat sink 12. The ends may be fastened to the first heat sink in any conventional manner which is heat-resistant. For example, fastening members, not shown, may be used or a heat-resistant adhesive may be employed.

A portion of the metallic membrane 56 is spaced apart from the first heat sink 12 to define a second chamber in which a thermally conductive fluid 58 is contained. The volume of the fluid is such that it completely fills the second chamber to provide a thermal path from the metallic membrane 56 of the first heat sink 12 and so that the fluid exerts a pressure on the metallic membrane even when the module 10 is installed in a vertical position, rather than the horizontal position shown in FIG. 1.

The thermally conductive liquid preferably includes distilled water, but this is not critical. The preferred liquid is distilled water with ten percent ethylene glycol. The ethylene glycol is antibacterial and retards oxidation on the aluminum heat sink 12 and metallic membrane 56. Substitutes are available. Phase-change salts which quickly give up energy when caused to boil are known, but are typically more expensive. A synthetic freon sold under the trademark FLORINERT by 3M Corp. may be substituted. However, in selecting a filler for the volume between the metallic membrane 56 and the first heat sink 12, viscosity is a concern. The thermal coefficients of the semiconductor chips 28-38 and the aluminum heat sinks are not closely matched. The temperature within the substrate chamber 24 may reach 100° C. Thus, it is advantageous to have a filler that is easily displaced, such as distilled water, rather than a material such as grease which flows more slowly.

In operation, the module 10 may be connected merely by attaching a connector to the outer lead ends 46 of the lead frame 42. The connection of plumbing to the module is not necessary, since the thermally conductive fluid 58 is sealed within the module. During manufacture, the metallic membrane 56 conforms to variations in the heights and angles of the integrated circuit chips 28-38. The thermally conductive fluid 58 provides a pressure for conforming the metallic membrane to the passive sides of the chips, thereby providing an efficient heat transfer path from the chips to the first heat sink 12. In FIG. 1, the integrated circuit chips 28, 30, 32 and 34 have coplanar passive sides, while the integrated circuit chip 36 is slightly higher. The difference in height of the chip 36 does not detrimentally affect the thermal exchange relationship between either the chip 36 and the metallic membrane 56 or the other chips 28-34 and 38 with the metallic membrane. Rather, minor deformations 60 and 62 of the membrane at opposite sides of the chip 36 ensure that the membrane lies in close contact with each of the integrated circuit chips.

The integrated circuit chips 28-38 are not necessarily of the same type. Different chips within the module 10 may perform different roles and may have varying heat-generating characteristics. Thus, the integrated circuit chip 36 may expand to a greater degree than the remaining chips 28–34 and 38. Again, the conformal heat transfer interface that comprises the metallic membrane 56 and the thermally conductive fluid 58 will conform to variations among the chips.

The metallic membrane 56 forms an electrical path from the integrated circuit chips 28–38 to the heat sink 12. Typically, the heat sink is grounded. The electrical path provides a desired ground to the back sides of the chips.

To maximize the thermal interface, a synthetic thermal grease may be used to coat the passive sides of the integrated circuit chips 28–38, thereby filling any minute crevices that are sometimes formed in the fabrication of integrated circuit chips. The synthetic thermal grease should also be used at the interface of the silicon substrate 26 and the second heat sink 14. In addition to the reasons noted above for using a silicon substrate, another reason is the thermal conductivity of silicon is greater than that of conventional printed circuit board materials. Thermal energy can be conducted from the substrate chamber 24 via the second heat sink as well as the first heat sink 12.

Utilizing the embodiment of FIG. 1, a multi-chip module 10 that is an integrated unit, i.e. a unit that does not require attachment to plumbing, may be manufactured with a significant improvement in the cooling capability relative to conventional modules. By lowering the temperature of each chip 28–38 and by ensuring a greater temperature uniformity among the chips, the chips can be placed closer together. Closer component spacing allows higher performance products, since the delays associated with long electrical paths among components are eliminated. Moreover, lower component junction temperatures are achieved, yielding a higher performance module.

The multi-chip module 10 encases the integrated circuit chips 28–38 and the substrate 26 within the aluminum heat sinks 12 and 14, thereby achieving a high degree of RF shielding. Operating frequencies of 500 MHz are anticipated. Radiation leakage from the multi-chip module could adversely affect surrounding circuitry. Particularly if the heat sinks are connected to ground potential, the multi-chip module offers protection against the radiation of RF energy from the module and the reception of RF energy by components and printed circuit traces within the module.

Figure 2:
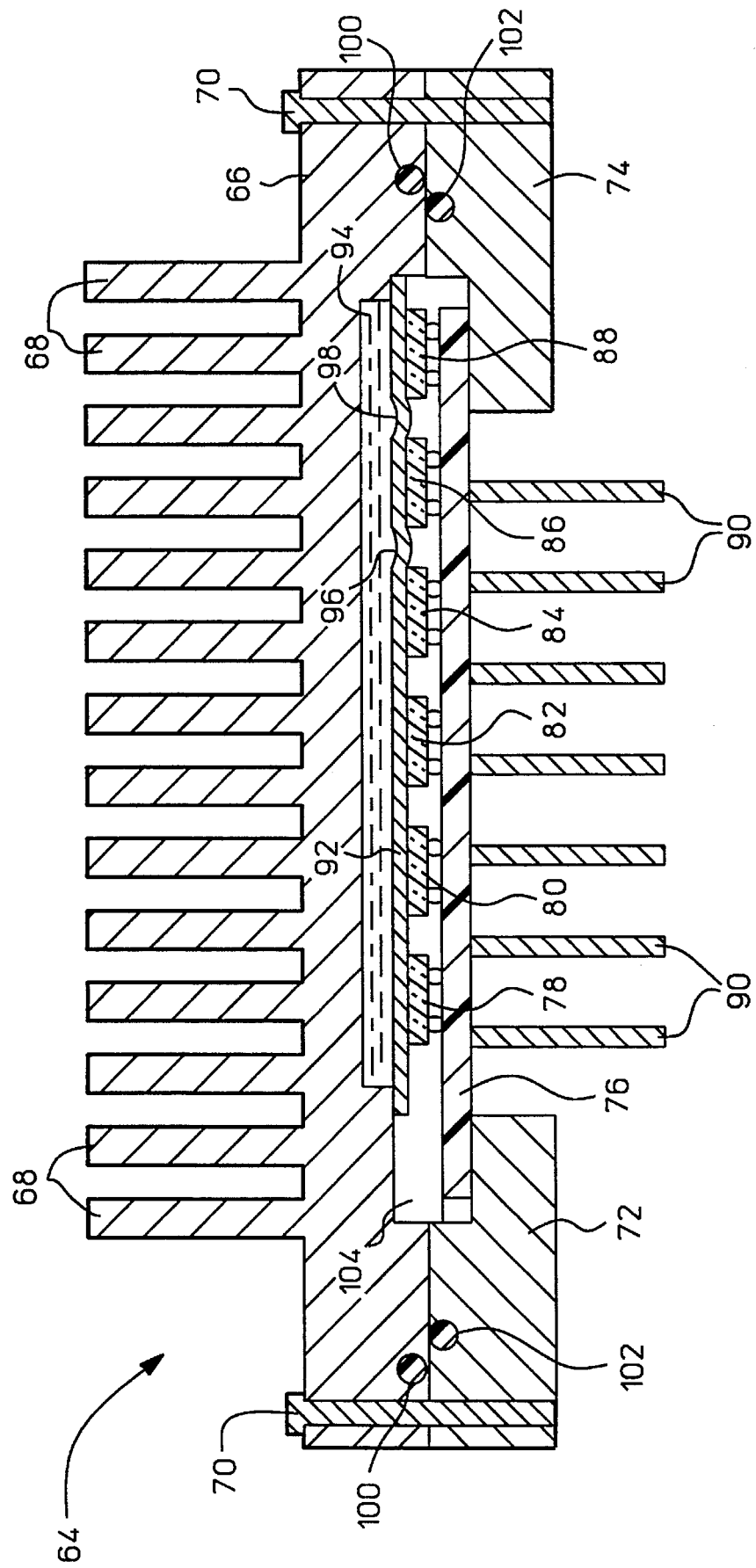
FIG. 2 is a side sectional view of a second embodiment of a multi-chip module having a conformal heat interface with an array of semiconductor chips.

A multi-chip module 64 having a single-sided heat exchanger 66 is shown in FIG. 2. The heat exchanger includes a number of parallel fins 68 to achieve the desired surface area for the release of thermal energy into the atmosphere. Screws 70 are received within internally-threaded bores of plates 72 and 74 to secure a printed circuit board 76 to the heat exchanger. Unlike the embodiment described above, the printed circuit board 76 is made of any one of the conventional materials for fabricating circuit boards to electrically interconnect a number of integrated circuit chips 78, 80, 82, 84, 86 and 88. Electrical communication between the module 64 and a motherboard or the like is achieved via metallic pins 90 that can be soldered into throughholes in the motherboard.

The module 64 includes a conformal heat transfer interface comprising a thin metallic membrane 92 and a thermally conductive liquid 94. The metallic membrane is a strip of stainless steel having a thickness of 0.001 inch. The liquid is preferably a solution of ninety percent distilled water and ten percent ethylene glycol having a thickness of 0.04 inch. The liquid exerts a maximum pressure of approximately three pounds per square inch on the metallic membrane, but this is not critical. This pressure ensures that the metallic membrane contacts the entire upper surface of each integrated circuit chip 78–88 regardless of variations in height and angle relative to the printed circuit board 76. Deformations 96 and 98 of the metallic membrane will occur to accommodate non-coplanarity of the upper surfaces of the integrated circuit chips.

A pair of o-rings 100 and 102 protect a substrate chamber 104 that houses the integrated circuit chips 78–88. While the single-sided cooling of FIG. 2 provides a somewhat lesser degree of cooling than the double-sided cooling of FIG. 1, both embodiments provide an integration of the structural support, protection from the external environment and the conformal heat transfer interface that allows production of an inexpensive but thermally efficient multi-chip module.

The integrated circuit chips 78–88 may be the carrierless type or may be integrated with a chip carrier. It is also possible to provide a thermally conductive post between each chip and the metallic membrane. Such posts can be manufactured to achieve a flatness that might not be achievable at the passive sides of the integrated circuit chip.

Optionally, more than one metallic membrane can be used on a single side of the substrate 26, if integrated circuit chips on that side differ significantly in size. Moreover, the double-sided cooling of FIG. 1 can be used in embodiments that do not include the conformal heat transfer interfaces described above. That is, the advantages of first and second opposed heat sinks to provide first and second thermal energy flow paths from a multi-chip substrate may be achieved without including a deformable liquid-backed membrane.

B. Mechanically Floating Substrate

Figure 3:
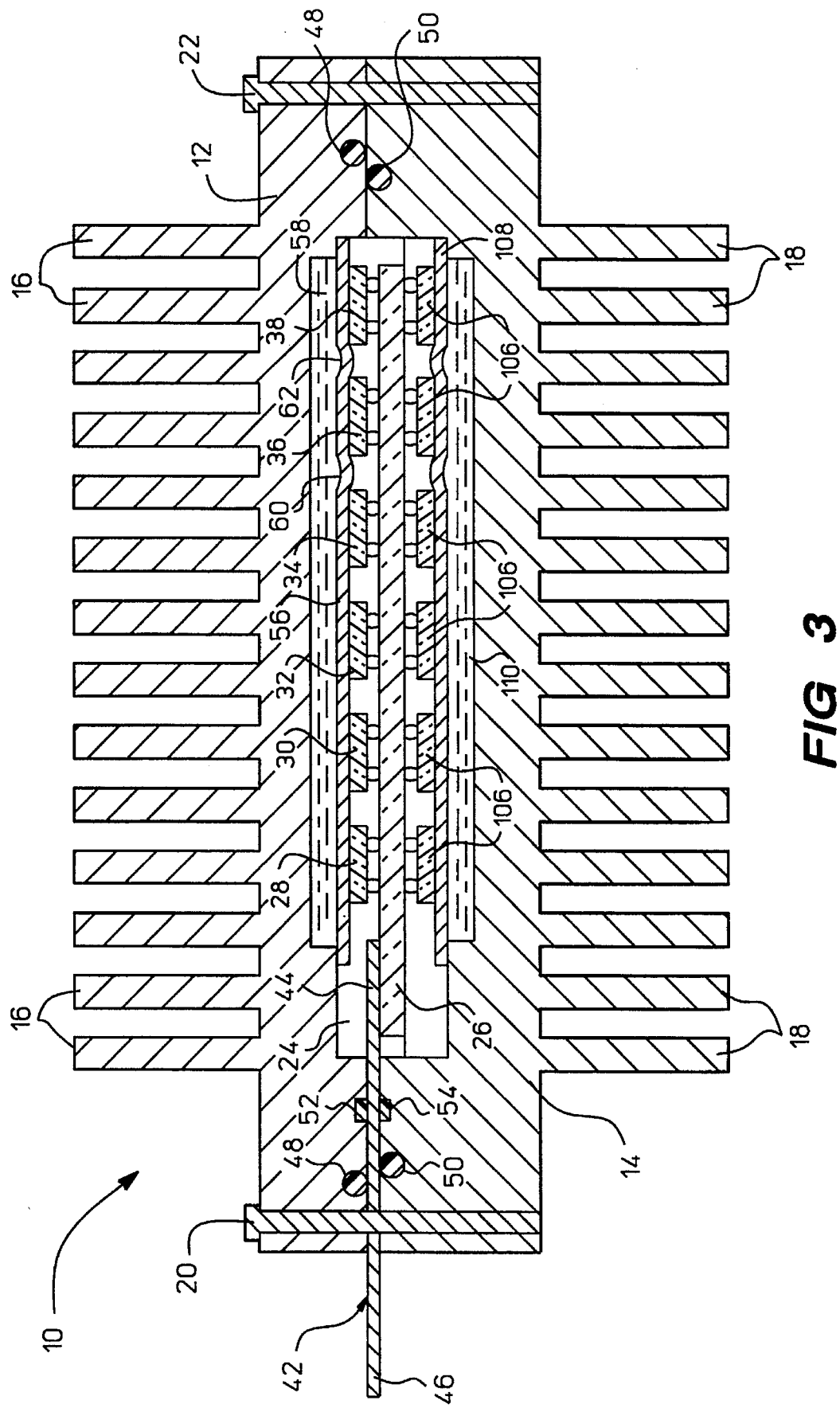
FIG. 3 is a side sectional view of a third embodiment of a multi-chip module, including integrated circuit chips mounted on opposed sides of a substrate that is floated mechanically in accordance with the present invention.
Figure 4:
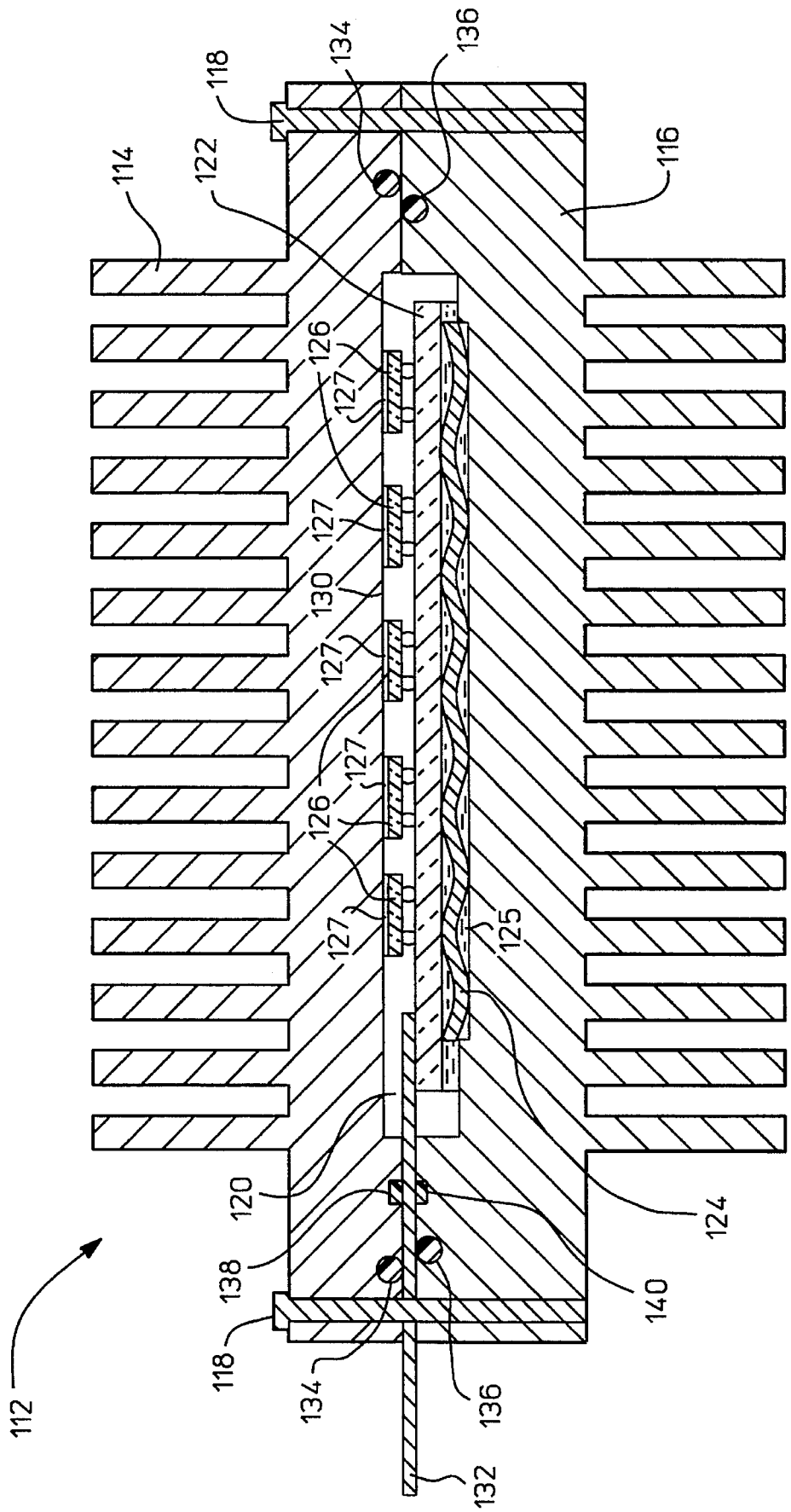
FIG. 4 is a side sectional view of a fourth embodiment of a multi-chip module, including a substrate that is floated mechanically by means of a biasing source.
Figure 5:
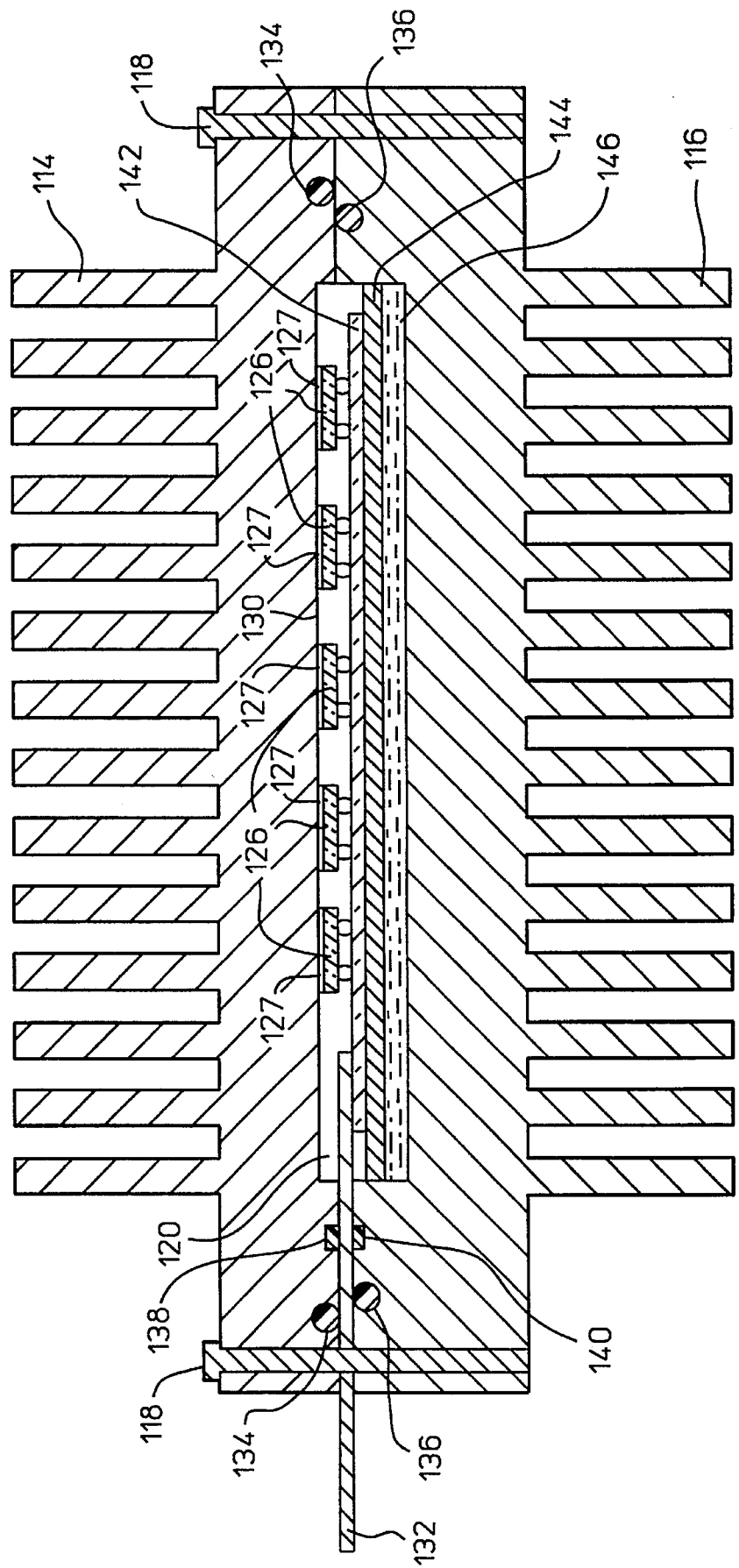
FIG. 5 is a side sectional view of a fifth embodiment of a multi-chip module having a mechanically floating substrate

FIGS. 3–5 illustrate embodiments in which a substrate is mounted within a substrate chamber of a heat exchanger to permit the substrate to mechanically float. Thus, the substrate can be maneuvered to selectively reposition integrated circuit devices, such as semiconductor chips. During assembly of a multi-chip module, the substrate may adapt to variations in the heights of the integrated circuit devices. During use, the substrate, the heat exchanger and the integrated circuit devices are likely to have different coefficients of thermal expansion, so that the mechanically floating substrate can be maneuvered to maintain desired device/exchanger interfaces.

Referring to FIG. 3, a second array of integrated circuit chips 106 is mounted to the bottom side of the silicon substrate 26 described above. A second conformal mechanism, comprising a metallic membrane 108 and a liquid 110 under pressure, is used to provide a thermal energy path from the chips 106 to the second heat sink 14. The double-sided substrate 26 and the chips 28–38 and 106 are allowed to float between the two conformal interfaces. Optionally, o-rings may be added to increase the stability of the double-sided substrate 26. Other than the addition of the second conformal arrangement, the embodiment of FIG. 3 is identical to that of FIG. 1, and the reference numerals of FIG. 1 have been applied to FIG. 3.

In FIG. 4, a multi-chip module 112 includes a heat exchanger comprised of first and second heat sinks 114 and 116. The heat sinks are held together by externally threaded screws 118. The first and second heat sinks 114 and 116 include cavities that are aligned to form a substrate chamber 120. A substrate 122 is mechanically floated within the chamber. A serpentine spring 124 biases the substrate 122 upwardly, thereby pressing integrated circuit devices 126 against an upper wall 130 of the substrate chamber 120. Preferably, a synthetic thermal grease 127 coats the passive sides of the integrated circuit devices in order to fill any minute crevices that may be formed during fabrication of the integrated circuit devices 126. Thermal grease 125 is also employed to pack the spring 124.

The integrated circuit devices 126 and the substrate 122 may be of the same type described with reference to FIG. 1. For example, the integrated circuit devices may be carrierless chips that are electrically and mechanically coupled to a silicon substrate 122 by solder bump techniques.

A multi-conductor interconnect 132 is joined at inner lead ends to the substrate 122. Outer lead ends of the interconnect are bonded or pressure-fit to a connector of a printed circuit board or the like. Interconnect 132 may be a multi-level member.

A pair of o-ring seals 134 and 136 protect the substrate chamber 120 from particle contaminants that may otherwise enter between the first and second heat sinks 114 and 116. Strips of sealing tape 138 and 140 are also used to protect the component surface of the substrate. In addition to protection from particle contaminants, the o-rings and the sealing tape prevent entrance of corrosion-inducing matter. In place of the o-ring seals, epoxy or polyimide may be injected between the heat sinks.

In operation, aluminum heat sinks 114 and 116 have a higher coefficient of thermal expansion than silicon chips 126. The temperature of the multi-chip module 112 may reach 100° C. As the temperature rises, the serpentine spring will act to ensure that the integrated circuit devices 126 remain compressed against the upper surface 130 of the substrate chamber 120. This also occurs during the cooldown of the multi-chip module. Thus, the thermal grease-packed spring 124 acts both as a strain release and as a means for moving the devices 126 upwardly in correspondence with expansion-induced movement of the upper wall 130.

Other spring mechanisms can be substituted for the serpentine spring 124 of FIG. 4. For example, an array of coil springs can be arranged under the substrate 122 to achieve the desired biasing of the substrate. Preferably the selected spring mechanism is thermally conductive, so as to provide a thermal path from the under side of the substrate to the lower heat sink 116.

FIG. 5 illustrates another embodiment of a multi-chip module having a mechanically floated substrate 142. In this embodiment the substrate rests atop a metallic membrane 144. The metallic membrane may be a stainless steel member having a thickness that does not exceed 0.001 inch. The membrane should be made of a ductile, tear-resistant material having a high coefficient of thermal conductivity. Between the membrane 144 and the surface of the second heat sink 116 is a fixed volume of thermally conductive fluid 146. The volume of fluid is such that it completely fills the region between the surface of the heat sink and the lower surface of the membrane 144. As a result, the fluid exerts a pressure on the membrane which is translated to the substrate 142 and ultimately to the integrated circuit devices 126. As in the case of the embodiment of FIG. 4, the mechanical floating of the substrate 142 functions both to provide a strain relief and to provide an adaptive mechanism for maintaining the thermal connection between the integrated circuit devices 126 and the upper surface 130 of the first heat sink 114.

The entrapped fluid 146 is preferably a liquid having a high thermal conductivity. A suitable liquid is distilled water with ten percent ethylene glycol. The ethylene glycol is antibacterial and retards oxidation of the aluminum heat sink 116 and the metallic membrane 144. However, substitute fluids are available.

I claim:

1. A multi-chip module comprising:

a substrate having a component surface;

a plurality of integrated circuit devices mounted on said component surface of said substrate;

a heat exchanger body having interior walls defining a substrate chamber, said substrate movably housed within said substrate chamber with said integrated circuit devices thermally coupled to a first interior wall of said heat exchanger body;

a serpentine spring for yieldingly holding said substrate within said heat exchanger body such that said substrate is displaceable relative to and towards said first interior wall of said heat exchanger body to accommodate non-uniformities with respect to thermal expansion coefficients and dimensional tolerances of said substrate, said heat exchanger body and said integrated circuit devices, wherein said serpentine spring is disposed to maintain said thermal coupling of said integrated circuit devices with said first interior wall; and thermal grease enclosing and embedding the spring.

2. The module of claim 1 further comprising a flexible interconnect means for conducting signals from said substrate to the exterior of said heat exchanger body.

3. The module of claim 1 wherein said heat exchanger body has a second interior wall on a side of said substrate opposite to said first interior wall, said serpentine spring being disposed between said substrate and said second interior wall for biasing said substrate in a direction of said first interior wall, said integrated circuit devices being mounted to said component surface in abutment with said first interior wall and said substrate.

4. A multi-chip module comprising:

a substrate having a component surface;

a plurality of integrated circuit devices mounted on the component surface of the substrate;

a heat exchanger body having first and second interior walls defining a substrate chamber, the substrate movably housed within the substrate chamber with the integrated circuit devices thermally coupled to the first interior wall;

thermal grease disposed between the substrate and the second interior wall; and a serpentine spring embedded within the thermal grease between the substrate and the second interior wall for yieldingly holding the substrate within the heat exchanger body and urging the substrate toward the first interior wall to maintain thermal coupling between the integrated circuit devices and the first interior wall while accommodating non-uniformities with respect to thermal expansion coefficients and dimensional tolerances of the substrate, the heat exchanger body and the integrated circuit devices.

5. A multi-chip module comprising:

a heat exchanger housing having a chamber with opposed first and second sides;

a substrate disposed within the chamber, the substrate having a plurality of integrated circuit devices having first faces aligned to abut the first side of the chamber;

a serpentine spring disposed between the substrate and the second side of the chamber for resiliently pressing the substrate to maintain abutment of the first faces of the integrated circuit devices against the first side of the chamber; and thermal grease packed about the spring.

6. The module of claim 5 wherein said serpentine spring supports said substrate to said housing in a manner to mechanically float said substrate within said chamber.

7. The module of claim 5 further comprising a flexible multi-conductor interconnect extending from said substrate to the exterior of said housing for electrical communication between said integrated circuit devices and an exterior device, said flexible interconnect being joined to said substrate to permit said substrate to mechanically float in said chamber.

* * * * *